United States Patent [19]

Forbes et al.

[11] Patent Number: 4,557,540
[45] Date of Patent: Dec. 10, 1985

[54] PROGRAMMED SOCKET AND CONTACT
[75] Inventors: Mel L. Forbes, Chardon; John T. Venaleck, Madison, both of Ohio
[73] Assignee: 4C Electronics, Inc., Mentor, Ohio
[21] Appl. No.: 571,737
[22] Filed: Jan. 18, 1984
[51] Int. Cl.[4] .......................................... H01R 23/72
[52] U.S. Cl. .............................. 339/17 CF; 339/18 R
[58] Field of Search ............. 339/17 R, 17 C, 17 CF, 339/17 LC, 17 L, 17 LM, 17 N, 18 R, 18 C; 29/847, 842, 843, 884; 174/52 FP; 361/406, 408

[56] References Cited
U.S. PATENT DOCUMENTS

| | | | |
|---|---|---|---|
| 3,202,954 | 8/1965 | Kinkaid | 339/17 LC |
| 3,290,757 | 12/1966 | Tanck | 29/847 |
| 3,745,895 | 7/1973 | Brandt et al. | 339/176 MP |
| 3,815,077 | 6/1974 | Anhalt et al. | 339/17 CF |
| 3,917,984 | 11/1975 | Kong et al. | 339/17 CF |
| 4,044,888 | 8/1977 | Schachter | 339/17 C |
| 4,052,117 | 10/1977 | Tengler et al. | 339/17 CF |
| 4,214,120 | 7/1980 | Jones, Jr. et al. | 339/17 CF |
| 4,423,920 | 1/1984 | Cooper et al. | 339/17 LM |

FOREIGN PATENT DOCUMENTS 955667  10/1974  Canada ........................ 339/17 LC OTHER PUBLICATIONS
IBM Bulletin, Roche, vol. 5, No. 11, p. 14, 4-1963.

Primary Examiner—Neil Abrams
Attorney, Agent, or Firm—Renner, Otto, Boisselle & Lyon

[57] ABSTRACT

An electrical contact pair for use in a programmed socket, a programmed socket using the contact pair and a method of making such a socket are disclosed. The programmed socket includes a printed circuit board with tracings for transposing pin positions between the input and output sides of the socket. The tracings end in pairs of terminal pads located on opposite sides of the printed circuit board. Each contact pair includes a pair of bases to be soldered to respective terminal pads and a male contact extending from one base and a female contact from the other base. The two bases are at least temporarily interconnected by an arcuate resilient strip which causes the bases to grip the terminal pads. This facilitates assembly and soldering since the contact pair will remain in position without additional support. Further the strip serves to position the contact pair accurately with respect to the edge of the printed circuit board. Once the contact pair is soldered in place, the strip connecting them may be severed, either by grinding, sawing or cutting to break the electrical continuity between the male and female contacts of each pair so that the transposition effected by the tracings takes place.

7 Claims, 9 Drawing Figures

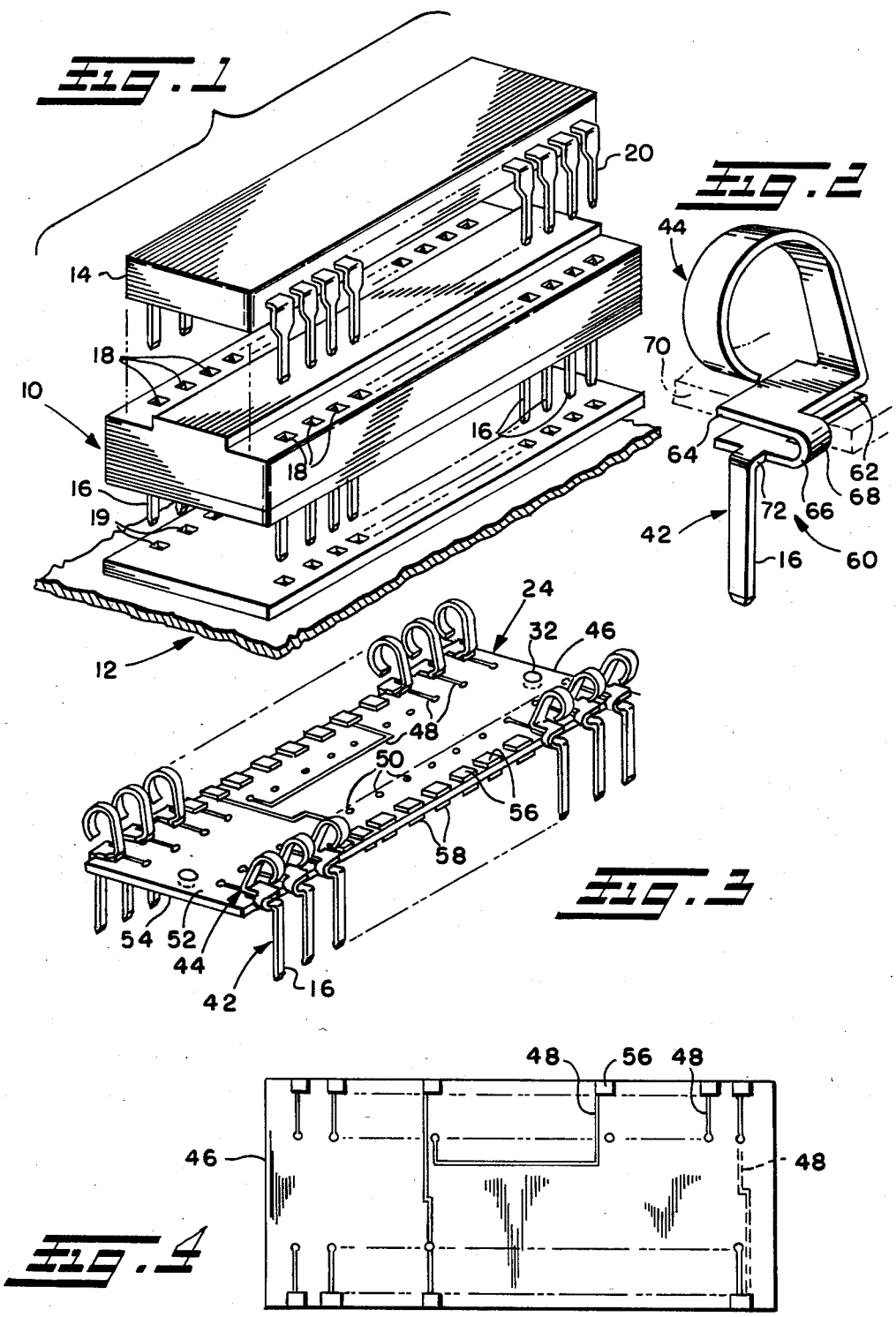

1 → 28
28 → 5
5 → 10
10 → 19
19 → 19
13 → 16
16 → 13
14 → 14
15 → 15
2 → 2 & 1

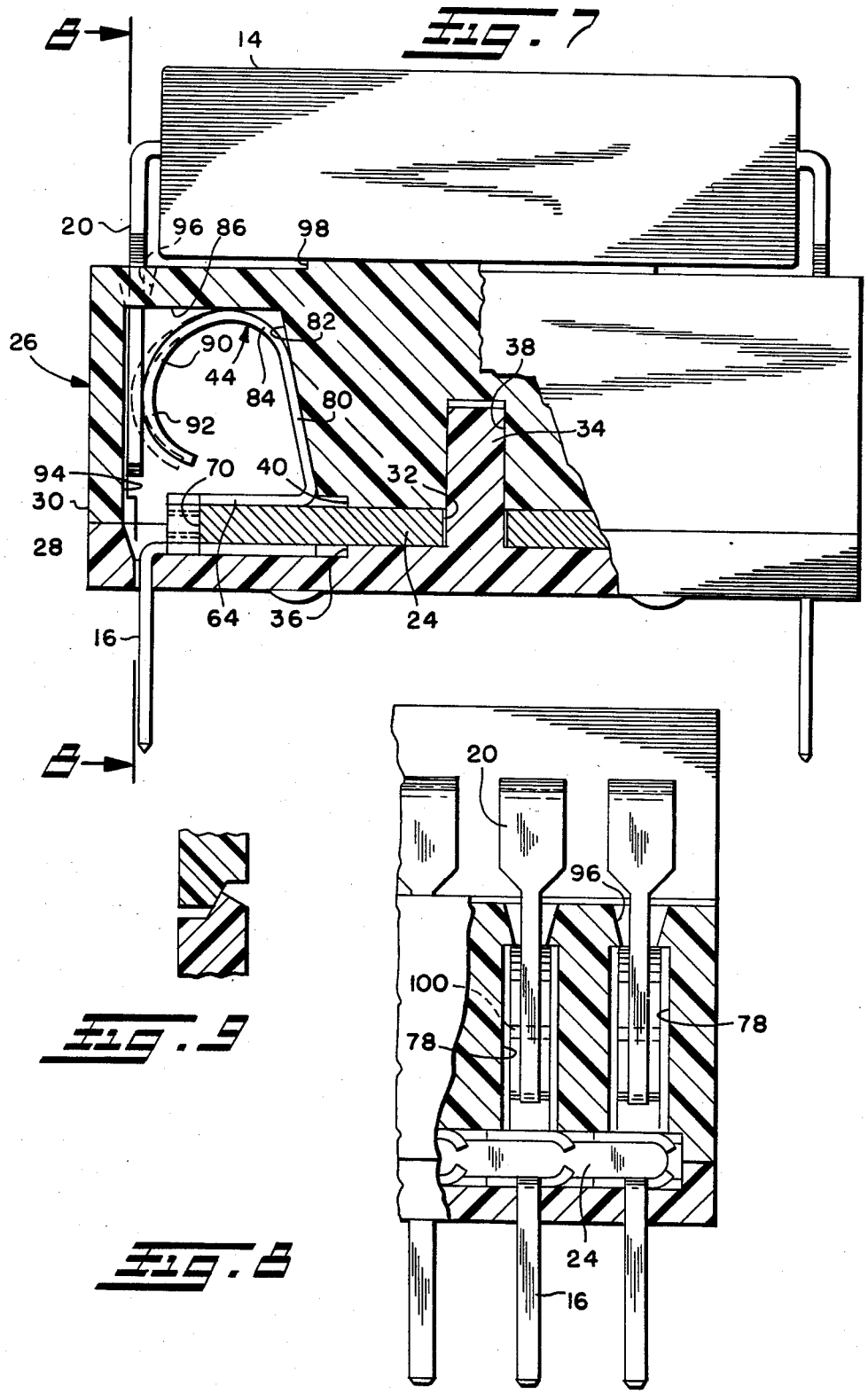

4,557,540

PROGRAMMED SOCKET AND CONTACT

TECHNICAL FIELD

The present invention relates to an improved programmed socket, improved components therefor, and to a method of making such a socket.

BACKGROUND OF THE INVENTION

In the electronics industry many components, especially solid state components such as microprocessors, read only memories, etc., are connected to other circuitry by means of pins extending from the component. The pins are arranged in a standard configuration to be removably inserted in a standard socket assembly which makes electrical contact with the pins. The socket itself is permanently connected with the remaining circuitry. Usually these components have "Dual In-line Pin" configuration consisting of 28 evenly spaced pins arranged in two parallel rows.

Electronic circuitry usually is designed for use with a particular integrated circuit or component such as a specific microprocessor manufactured by a specific manufacturer and having a specific pin-out pattern or configuration, whereby, for example, pin No. 1 of the integrated circuit package may be intended to connect with a voltage source, pin No. 2 may be an interrupt input for the microprocessor, pin No. 3 may be a ground connection, etc. The layout of the interconnections of printed circuit traces on a printed circuit board intended to use a specified microprocessor usually are designed for use with a particular microprocessor of a particular manufacturer. However, occasions arise that it becomes desirable, even necessary, to substitute in an electronic circuit a different integrated circuit device than the one for which the electronic circuit originally was designed. In such a case it is possible that a new integrated circuit device or electronic component having desirable internal characteristics or functions cannot or cannot readily be substituted because it may have a pin-out configuration that is different from the pin-out configuration of the original integrated circuit device.

To overcome this difficulty programmed sockets have been developed to adapt an integrated circuit device with one pin-out configuration for use in circuitry designed for use with an integrated circuit device that has a different pin-out configuration. Once such programmed socket is disclosed in a commonly assigned U.S. patent application entitled "Programmed Socket", Ser. No. 471,280, filed Mar. 2, 1983 and such application is incorporated herein in its entirety by reference.

SUMMARY OF THE INVENTION

The present invention provides an improved programmed socket, improved components therefor and an improved method for making a programmed socket. According to the present invention a pair of electrical contacts, one a pin and the other the contact part of a pin-receiving socket, are integrally formed and remain mechanically interconnected during initial steps in the manufacturing process. The mechanical interconnection enables the contact pair to be positioned accurately on a printed circuit board which forms a part of the finished programmed socket. The printed circuit board has an opposed pair of terminal pads on opposite sides of the circuit board for each contact pair and appropriate conductors interconnecting the various pads on opposite sides of the board in a manner dictated by the pin-out configurations of the original electronic component and the replacement electronic component. Once positioned on the printed circuit board, the contacts are each soldered to their respective pads. The mechanical interconnection between them is then severed. The circuit board is placed inside a plastic housing with the pins extending outward and the housing is then welded shut.

The contacts of the electrical contact pair and corresponding sides of the printed circuit board may be termed upper and lower contacts and sides, respectively, for convenience of description. Both the upper and lower contacts have planar bases which are aligned with each other on opposite sides of the printed circuit board. Each of the bases is in contact with a corresponding terminal pad on the circuit board, and each may be coated with solder to facilitate soldering to such terminal pads. The lower contact includes a pin with a generally rectangular cross section extending downward perpendicular to the bases. The pin is of a standard proportion to fit in a standardized electronic component socket.

The upper contact includes a yieldable arcuate portion formed from a flat band which extends upward from the upper base portion. The arcuate portion is disposed so that the axis of the pin of the lower contact is tangent to it or defines a relatively short chord across it. The arcuate portion of the upper contact is adapted to fit inside a cavity in the housing with a pin receiving opening thereabove.

Because the upper contact is formed from a flat band it makes "line contact" with a pin from an electronic component inserted into the programmed socket. Moreover, because of the arrangement of the upper and lower contacts, electronic components with the same dual-in-line pin configuration but with different internal circuitry which necessitates transposition of conductors from the socket may be interchanged using the programmed socket of the present invention.

Accordingly, it is an object of the present invention to provide an improved contact pair for use in manufacturing a programmed socket.

It is a further object of the present invention to provide an improved method of manufacturing a programmed socket in the improved programmed socket manufactured by the method.

The invention, then, comprises the features hereinafter fully described and particularly pointed out in the claims. The following description and annexed drawings set forth in detail an illustrative embodiment of the invention which is indicative of but one of the various ways in which the principles of the present invention may be carried out.

BRIEF DESCRIPTION OF THE DRAWINGS

In the annexed drawings:

FIG. 1 is an exploded perspective illustration of an electronic component, a programmed socket constructed in accordance with the present invention, and a portion of an electronic circuit;

FIG. 2 is a perspective illustration of a contact constructed in accordance with and for use in the present invention;

FIG. 3 illustrates a printed circuit board with contacts which form a part of the present invention;

FIG. 4 is a plan view of one side of the circuit board of FIG. 3;

FIG. 7 is a partial section view showing an electronic component plugged into the programmed socket constructed in accordance with the present invention;

FIG. 8 is a view taken along the line 8—8 of FIG. 7; and

FIG. 9 illustrates a portion of the upper and lower caps which surround the circuit board of FIG. 3 prior to being welded together.

DESCRIPTION OF PREFERRED EMBODIMENT

Figures 5, 6:
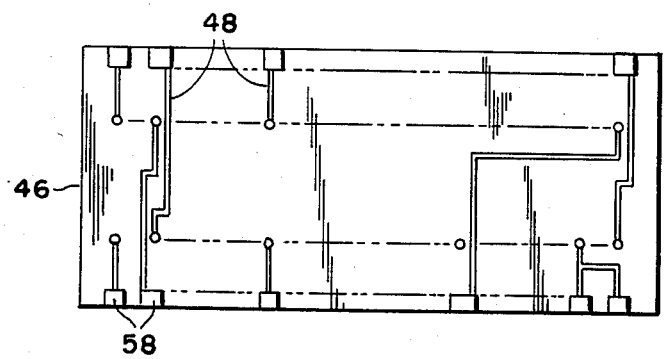
FIG. 5 is a plan view of the opposite side of the circuit board of FIG. 4.
FIG. 6 is a table illustrating a possible transposition of pin configurations achievable by the present invention.

FIG. 1 illustrates a programmed socket 10 disposed between a circuit board of electronic circuitry 12 and an electronic component 14. The component 14 may be a microprocessor, a read-only memory, etc. The programmed socket 10 includes a dual in-line arrangement of pins 16 extending downward from its lower surface and an arrangement of dual in-line sockets 18 on its upper surface. Both are industry standard configurations, so that the programmed socket 10 will be readily received in the socket 19 on circuit board 12 originally intended to receive an electronic component.

The programmed socket 10 includes internal wiring which, in effect, transposes the locations of the pins 20 of the substitute component 14 so that the substitute component 14, and the programmed socket 10 can function as a replacement for the component originally intended to be utilized in the electronic circuit 12. Although the programmed socket 10 has pins 16 and sockets 18 which are both in the standardized dual in-line pin arrangement, it need not be so, and the rows of pins 16 could be spaced from each other a different distance from the rows of sockets, if this were required.

The programmed socket 10 (FIG. 7) includes a printed circuit board 24 mounted in a housing 26 formed from a lower cap 28 and an upper cap 30. The printed circuit board 24 includes two locating holes 32 through which pins 34 extending upward from a raised central portion 36 of the lower cap 28 extend. The pins 34 pass through the holes 32 in the printed circuit board 24 and are received in corresponding passages 36 formed in the upper cap 30. Because of the snug fit between the pin 34, hole 32, and passage 36, the pins serve to accurately position the upper and lower caps 28 and 30 with respect to the printed circuit board 24. Since the printed circuit board 24 rests on the raised portion 36 of the lower cap 28 and is pressed against by a downwardly extending portion 40 of the upper cap 30, the printed circuit board is also accurately positioned in a direction parallel to the axis of the pin 34 with respect to both the upper and lower caps.

The printed circuit board is shown in FIG. 3 with the upper and lower caps 28 and 30 removed. The printed circuit board 24 includes male and female electrical contacts 42 and 44, respectively, in two parallel rows. The male contacts 42 include the pins 16 which extend downward just beyond opposite lateral edges of the printed circuit board 24. The female contacts 44 extend upward into parallel rows, each in paired relation with one of the male contacts below.

The printed circuit board 24 itself includes a support board 46 of electrically nonconductive material. Printed circuit traces 48 are formed on the support 46 in a conventional manner. The support 46 has a plurality of holes 50 therethrough, each of which preferably is plated through to provide an electrically conductive path from the top surface 52 to the bottom surface 54 of the support 46. The layout of the printed circuit traces 48 is determined according to the relationship between the original and replacement electronic components, and the printed circuit traces and plated-through holes 50 are formed on and through the support 46 in a conventional manner, for example, using a photo-etching and plating technique. (Reference to top and bottom or upper and lower as well as to the surfaces and sides herein are for convenience only and are not intended to be limiting with respect to the configuration or operation of the programmed socket.)

Each of the printed circuit traces 48 terminates in a terminal pad such as shown at 56 in FIG. 3. Preferably, pads 56 on the top 52 and the corresponding pads 58 on the bottom or lower surface of the support are arranged in identical, dual in-line, pattern, as shown in the drawings, and therefore the pad 56 is directly over the pad 58. In the illustrated embodiment there are 28 contact locations and therefore contact pads on each side of the support 46 which correspond in number and spacing to the pins of a conventional 28-pin DIP integrated circuit device.

In assembling the male contacts 42 and the female contacts 44 on a printed circuit board 24, the contact pair 60 shown in FIG. 2 is used. The contact pair 60 is integrally formed of suitably electrically conductive and resilient metal. The contact pair 60 may be monolithic or may be formed from a resilient base metal core plated with an electrically conductive material such as a precious metal.

The contact pair 60 includes a pair of parallel bases 62 and 64 connected by an arcuate strip 66. The arcuate strip 66 not only determines the spacing between the parallel bases 62 and 64, but also assists in locating the contact pair 60 on the printed circuit board 24. The bases 62 and 64 are about as wide as the contact pads 56 and 58 and are spaced apart a distance so that when slipped into position over the edge of a printed circuit board 24, they resiliently engage corresponding terminal pads while the side 68 of the arcuate strip 66 bears against the edge 70 of the support 46. The bases 62 and 64 may be precoated with a thin layer of solder to facilitate soldering of the bases to the pads 56 and 58, a technique well known in the art.

The lower base 62 (as oriented in the figures) supports the male contact 42 which includes the pin 16. The pin 16 has a generally rectangular cross section with a tapered tip which is conventional. The pin 16 is about half of the width of the base 62 and extends perpendicular to the plane of the base along an axis displaced outwardly from the edge 70 of the support 46. The pin 16 is connected to the base 62 by means of a short leg 72.

The female contact 44 extends from and is integrally formed with the upper base 64. As is more fully discussed below, the female contact 44 cooperates with a recess 78 formed in the upper cap 30 to form a socket 18. For the present purposes it is sufficient to state that the female contact is formed from an extension of the upper base 64 which has a generally rectangular cross section and whose width is about two-thirds the width of the base. The strip is curved to form a resilient pin engaging member which will press against the pins 20 of the electronic component 14 when it is inserted into the socket 18 of the programmed socket 10.

The above described contact pair 60, i.e., male and female contacts 44 and 46 and the interconnecting curved strip 66, makes assembly of the male and female contacts on the printed circuit board 24 a simple matter. Each contact pair 60 is positioned with the respective arcuate strip 66 abutting the edge 70 of the support 46 and the bases 62 and 64 superimposed on pads 58 and 56, respectively. The resiliency in the curved or arcuate connecting strip 66 enables the bases 62 and 64 to grip the terminal pads 56 and 58 with sufficient force to maintain the contact pair 60 in their proper location during soldering. This soldering is accomplished in any of the usual ways and may preferably be done by placing the entire circuit board with the 28 contact pairs placed along its opposite lateral edges in an oven to allow the thin solder film on the bases 62 and 64 and the terminal pads 58 and 56, respectively, to melt together.

After soldering, the arcuate strip 66 connecting the bases 62 and 64 may be severed to electrically isolate the male contact 42 from the female contact 44. This is done for all the contact pairs 60 except those where electrical continuity between the male and female contacts of the same contact pair is desired. The severing of the arcuate strips may be accomplished with a small pair of clippers or snips. Alternatively, if the connection between all of the contact pairs along a single side of the printed circuit board 24 are to be cut, a grinder or a circular saw rotating in the plane of the printed circit board may be used.

Once the required connecting strips 66 have been cut, the upper cap 30 and lower cap 28 are put in place around the printed circuit board 24. As discussed above, the upper cap 30 includes recesses 78 which cooperate with the female contact 44 to make pin receiving sockets. Specifically, the female contact 44 includes an initial portion 80 which extends upward after a sharp bend from the end of the base 64 remote from the edge 70 of the printed circuit board 24 at an angle of about 80°. This initial portion 80 rests flatly against a similarly inclined surface 82 in the recess or cavity 78. The initial straight portion 80 has a length approximately equal to the length of the base 64 and is followed by a curved section with a radius about equal to the width of the female contact strip and extending through about a 95° arc. This curved portion 84 abuts or is tangent with the inside top surface 86 of the recess 78 in the upper cap 30. The curved section 84 is followed by a short straight section 90 which in turn is followed by an arcuate section 92. The arcuate section 92 forms the pin engaging surface of the female contact 44. Specifically, as shown in FIG. 7, the curved portion 92 is initially in the position shown in phantom spaced a distance less than the thickness of the pin 20 (FIG. 1) from a vertical interior side wall 94 of the upper cap 30.

The upper cap 30 also includes a plurality of frustopyramidal openings 96 in its uppermost surface. There are 28 openings 96 each one being aligned with and extending into a recess 78 formed in the upper cap 30. Specifically, each of the openings 96 is continuous with the vertical interior side wall 94 of the recess 78. When the electronic device 14 is installed in the programmed socket 10, each of the pins 20 is guided through the tapered opening 96 and engages the curved portion 92 of the female contact member 44. As the electronic component 14 is pressed further downward, the female contact member 44 deflects inward to the position shown in solid in FIG. 7 with the flexure taking place primarily in the curved portion 84. The electronic component 14 is pressed downward until it seats against an elevated surface 98 formed in the top of the upper cap 30. This elevated surface 98 provides a small gap between the bottom of the electronic component 14 and the top of the programmed socket 10 so that the electronic component may be more easily removed.

Since the female contacts 44 are made from a curved flat strip, they make relatively broad line contact with the pins 20. For example, as illustrated in FIG. 8, contact between the pin 20 and the female contact 44 may occur across the area shown by dotted lines and indicated by the numeral 100. Such broad contact has much greater electrical reliability and lower resistance than if the female contact 44 were made of a wire with a circular cross section. The resilient curved shape of the female contact 44 allows repeated insertion and withdrawal of the electronic component 14 without water or reducing the efficiency of the connection.

The lower and upper caps 28 and 30 are formed of an insulating plastic material. The peripheral edges of the lower and upper caps may be initially formed with the profiles shown on an enlarged scale in FIG. 9. When the upper and lower caps are pressed together and subject to ultrasonic heating, the edges melt into each other permanently sealing the programmed socket.

Thus it is clear that the present invention provides an improved contact pair 60 (FIG. 2) for use in a programmed socket 10, and an improved programmed socket. Moreover, the present invention provides an improved method of making a programmed socket and the socket made by such improved method. Specifically the present invention provides a contact pair 60 including a male and female contact interconnected by means of an arcuate strip 66 at least during initial assembly of the device. Once the contacts have been soldered to a printed circuit board 24, the interconnecting strip 66 may be severed, but prior to that time the strip both positions the contact pair with respect to the edge of the printed circuit board and resiliently biases the male and female contacts together to hold them in the proper location during soldering. Moreover the contacts 44 and 46 of each pair 60 are formed from a flat strip of material and hence make line contact with whatever other contacts they engage upon installation.

What is claimed is:

1. An electrical contact pair mechanically connected for use in manufacturing and mechanically disconnectable for use in the operation of a programmed socket having a printed circuit board and arrays of terminal pads on each side of the board connected by tracings, said contact pair comprising a lower contact with an axially extending pin portion and a lower planar base generally normal to the axis of said pin portion for making an electrical connection with one of the terminal pads on the lower side of the printed circuit board, an upper contact with an upper planar base parallel with said lower planar base for making an electrical conection with one of the terminal pads on the upper side of the printed circuit board an an arcuate portion formed from a flat strip curved about an axis parallel to said planar bases, and connecting means for connecting said upper contact with said lower contact during manufacture of a programmed socket, said connecting means including a severable flat strip of material curved between the planar bases of said upper and lower contacts about an axis normal to the axis of said arcuate portion, said flat strip of material being severable after the contact bases have been electrically attached to respective terminal pads of the printed circuit board thereby leaving two mechanically separate contacts on opposite sides of the printed circuit board.

2. The contact of claim 1 wherein said connecting means includes means for urging said upper and lower base portions toward each other thereby to grip opposing terminal pads on the printed circuit board.

3. The contact of claim 1 wherein said upper electrical contact includes a first portion contiguous with said upper base and forming an acute angle therewith, said first portion being generally straight, and said arcuate portion being contiguous with said first portion and remote from said acute angle.

4. The contact of claim 3 wherein said arcuate portion of said upper electrical contact includes surface means for engaging a flat electrical contact with straight line contact generally perpendicular to the axis of such a contact.

5. The contact of claim 1 wherein said contact is integrally formed of metal.

6. The contact of claim 2 wherein said opposed surfaces of said upper and lower bases include a surface coating of solder.

7. The contact of claim 5 wherein said metal includes a core of base metal and a layer of precious metal.

* * * * *